(12) United States Patent
Ghosh et al.

(10) Patent No.: US 7,644,753 B2
(45) Date of Patent: Jan. 12, 2010

(54) DOMED HEAT EXCHANGER (PORCUPINE)

(75) Inventors: Debashis Ghosh, Williamsville, NY (US); Mohinder Singh Bhatti, Amherst, NY (US)

(73) Assignee: Delphi Technologies, Inc., Troy, MI (US)

( * ) Notice: Subject to any disclaimer, the term of this patent is extended or adjusted under 35 U.S.C. 154(b) by 369 days.

(21) Appl. No.: 11/439,364

(22) Filed: May 23, 2006

(65) Prior Publication Data

US 2007/0284092 A1    Dec. 13, 2007

(51) Int. Cl.
*F28D 15/00*    (2006.01)
*H05K 7/20*    (2006.01)

(52) U.S. Cl. .............. 165/104.33; 165/104.26; 361/700

(58) Field of Classification Search ............ 165/104.33, 165/104.26; 361/700
See application file for complete search history.

(56) References Cited

U.S. PATENT DOCUMENTS

| | | | | |
|---|---|---|---|---|
| 4,191,168 A * | 3/1980 | Allen et al. ................ | 126/648 |
| 4,884,627 A * | 12/1989 | Abtahi ................... | 165/104.26 |
| 5,199,165 A | 4/1993 | Crawford et al. | |
| 5,299,090 A | 3/1994 | Brady et al. | |
| 5,529,115 A * | 6/1996 | Paterson ................ | 165/104.33 |
| 5,803,161 A * | 9/1998 | Wahle et al. ........... | 165/104.21 |
| 6,085,831 A | 7/2000 | DiGiacomo et al. ..... | 165/104.33 |
| 6,237,223 B1 * | 5/2001 | McCullough .......... | 29/890.032 |
| 6,705,390 B2 * | 3/2004 | Ohara ................... | 165/104.21 |
| 6,807,059 B1 | 10/2004 | Dale | |
| 6,918,431 B2 * | 7/2005 | Reyzin et al. .......... | 165/104.21 |
| 6,942,025 B2 * | 9/2005 | Nair et al. ................. | 165/185 |
| 2003/0102110 A1 * | 6/2003 | Wagner .................... | 165/80.3 |
| 2004/0011511 A1 * | 1/2004 | Ghosh et al. ........... | 165/104.21 |
| 2005/0039881 A1 | 2/2005 | Reyzin et al. | |
| 2006/0181860 A1 | 8/2006 | Larson | |

FOREIGN PATENT DOCUMENTS

| | | |
|---|---|---|
| DE | 35 42 011 | 6/1987 |
| DE | 20 2006 003958 | 6/2006 |
| JP | 1264296 | 10/1989 |

OTHER PUBLICATIONS

European Search Report dated Sep. 4, 2007.

* cited by examiner

*Primary Examiner*—Cheryl J Tyler
*Assistant Examiner*—Brandon M Rosati
(74) *Attorney, Agent, or Firm*—Patrick M. Griffin

(57) ABSTRACT

Three embodiments of a heat exchanger assembly for cooling an electronic device are shown respectively in FIGS. 1-2, 3 and 4 and each comprises a flange, a dome, a plurality of condensing tubes, a shroud, and a boiler plate. In the first embodiment shown in FIG. 1, the dome is semi-spherical in shape and the distance measured axially along the center axis equals the distance measured laterally from or perpendicular to the center axis. In the second and third embodiments shown in FIGS. 3 and, 4, respectively, the distance measured axially along the center axis is greater than the distance measured laterally from or perpendicular to the center axis. The domes in the second and third embodiments are an ellipsoid and a semi-logarithmic body, respectively. In all embodiments, a plurality of condensing tubes aligned in fan rows and arced rows extend from the dome to distal ends to facilitate more-efficient heat transfer.

11 Claims, 7 Drawing Sheets

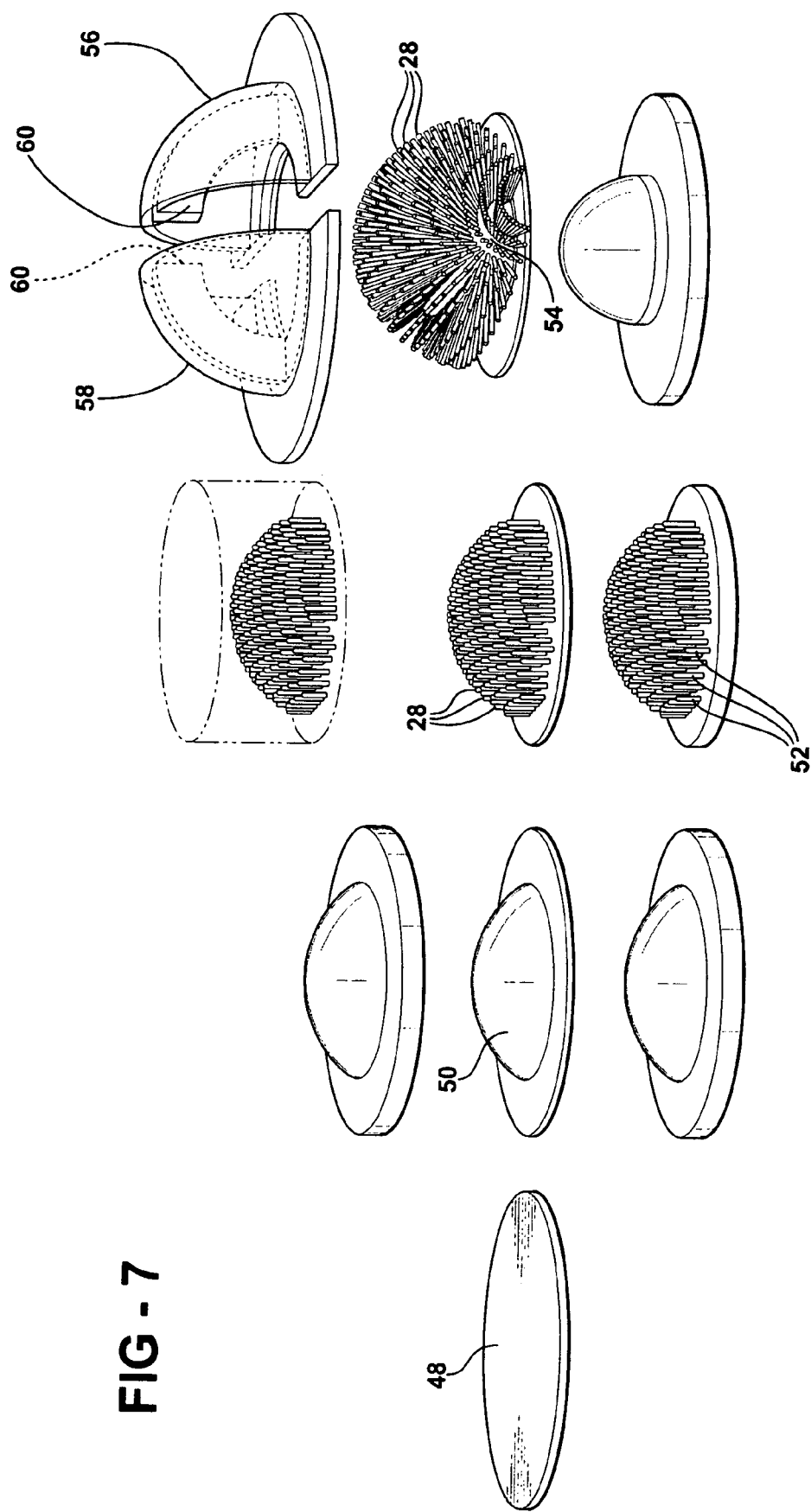

DOMED HEAT EXCHANGER (PORCUPINE)

CROSS REFERENCE TO RELATED APPLICATION

This application discloses and claims the broad concept of a domed heat exchanger as well as one species. However, co-pending application Ser. No. 11/439,063 filed May 23, 2006 discloses and claims a second patentably distinct species under the broad concept claimed herein.

BACKGROUND OF THE INVENTION

1. Field of the Invention

The present invention relates to a heat exchanger for cooling an electronic device.

2. Description of the Prior Art

The operating speed of computers is constantly being improved to create faster computers. With this improvement, comes increased heat generation and a need to effectively dissipate that heat.

Heat exchangers and heat sink assemblies have been used that apply natural or forced convection cooling methods to dissipate heat from electronic devices that are highly concentrated heat sources such as microprocessors and computer chips. These heat exchangers typically use air to directly remove heat from the electronic devices; however air has a relatively low heat capacity. Thus, liquid-cooled units called LCUs employing a cold plate in conjunction with high heat capacity fluids have been used to remove heat from these types of heat sources. Although LCUs are satisfactory for moderate heat flux, increasing computing speeds have required more effective heat sink assemblies.

Accordingly, thermosiphon cooling units (TCUs) have been used for cooling electronic devices having a high heat flux. A typical TCU absorbs heat generated by the electronic device by vaporizing the working fluid housed on the boiler plate of the unit. The boiling of the working fluid constitutes a phase change from liquid-to-vapor state and as such the working fluid of the TCU is considered to be a two-phase fluid. The vapor generated during boiling of the working fluid is then transferred to a condenser, where it is liquefied by the process of film condensation over the condensing surface of the TCU. The heat is rejected into a stream of air flowing through a tube running through the condenser or flowing over fins extending from the condenser. Alternatively, a second refrigerant can flow through the tube increasing the cooling efficiency. The condensed liquid is returned back to the boiler plate by gravity to continue the boiling-condensing cycle.

An example of a cooling system for electronic devices is disclosed in U.S. Pat. No. 6,085,831 to DiGiacomo et al.

The DiGiacomo patent discloses a TCU including a housing having a lower portion for holding a refrigerant and an upper portion having a top wall wherein heat transfer fins are disposed on the top wall. The upper portion of the housing includes a plurality of condensing chambers extending upwardly and outwardly along a single vertical plane from the lower portion of the housing. A TCU comprising a condenser and a boiling chamber is generally limited by the lack of space available for effective condensing. The boiling intensity of the refrigerant over the electronic device is generally high since the heat source is highly concentrated over the small area of the electronic device.

Although the prior art dissipates heat from electronic devices, as computing speeds increase, there is a continuing need for cooling devices having more efficient or alternative heat transfer capabilities as compared to the conventional electronic cooling assemblies.

SUMMARY OF THE INVENTION AND ADVANTAGES

The invention provides for an orientation insensitive heat exchanger assembly including a boiler plate for disposition over and cooling an electronic device. The assembly includes a dome disposed on a boiler plate to define a boiling chamber that houses a refrigerant for undergoing a liquid-to-vapor-to-condensate cycle in response to the heat generated by the electronic device. A plurality of spaced condensing tubes is disposed in a plurality of fan rows and extends from the dome to distal ends. A shroud encloses the distal ends of the condensing tubes in spaced relationship to the dome for moving air over the condensing tubes and over the dome. The shroud and the distal ends of the condensing tubes are disposed in a domed shape in spaced relationship to the dome.

The invention also includes a method of fabricating a heat exchanger assembly of the species including a plurality of condensing tubes extending from a dome comprising the steps of forming a plurality of condensing tubes extending vertically from an upper surface of a plate to distal ends in fan rows extending parallel to a center axis of the plate, and forcing a domed die into the bottom surface of the plate to shape the plate into the dome with the condensing tubes in each fan row diverging from one another in fan-like fashion and the distal ends being disposed in a domed shape in spaced relationship to the dome.

The present invention operates with a high fin effectiveness. The invention provides a high amount of condensing tube surface area in a relatively small overall volume through the use of a multitude of discrete condensing tubes in the boiling chamber.

Additionally, the invention functions with a low fluid inventory. A small amount of refrigerant is needed to dissipate the heat generated by the electronic device. Also, the design of the invention makes it readily scaleable. The invention can easily be made to engage tiny computer chips as well as high-powered devices of large telecom towers. Finally, the design of the invention adapts well to and is tolerant of defects in manufacturing. The design is robust. Minor structural imperfections will not render the invention unusable.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 7 is a schematic illustrating an alternative method of fabricating one species of the invention.

DETAILED DESCRIPTION OF THE INVENTION

Figure 1:
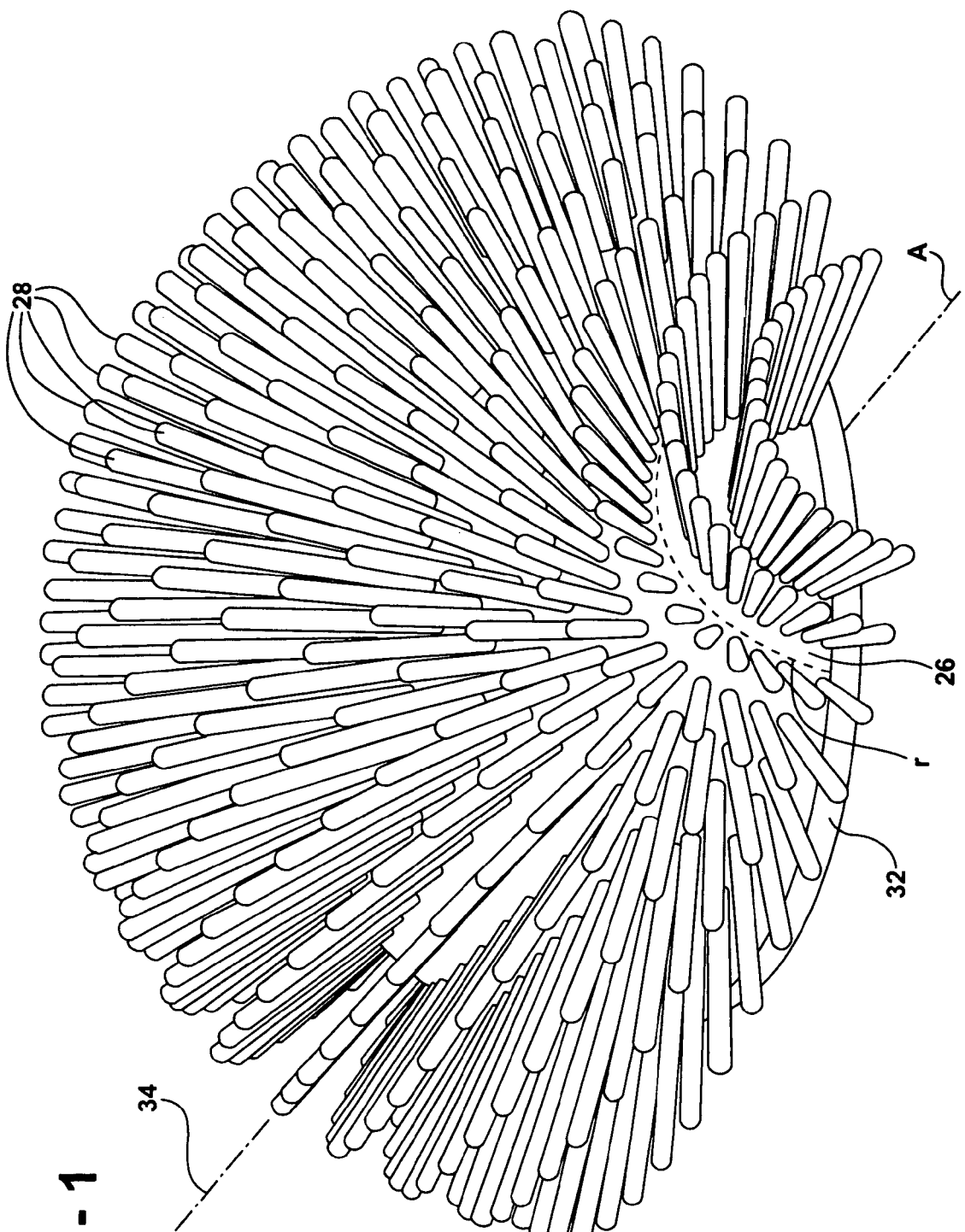
FIG. 1 is a perspective view of a first embodiment of the invention employing an overall semi-spherical shape.
Figure 2:
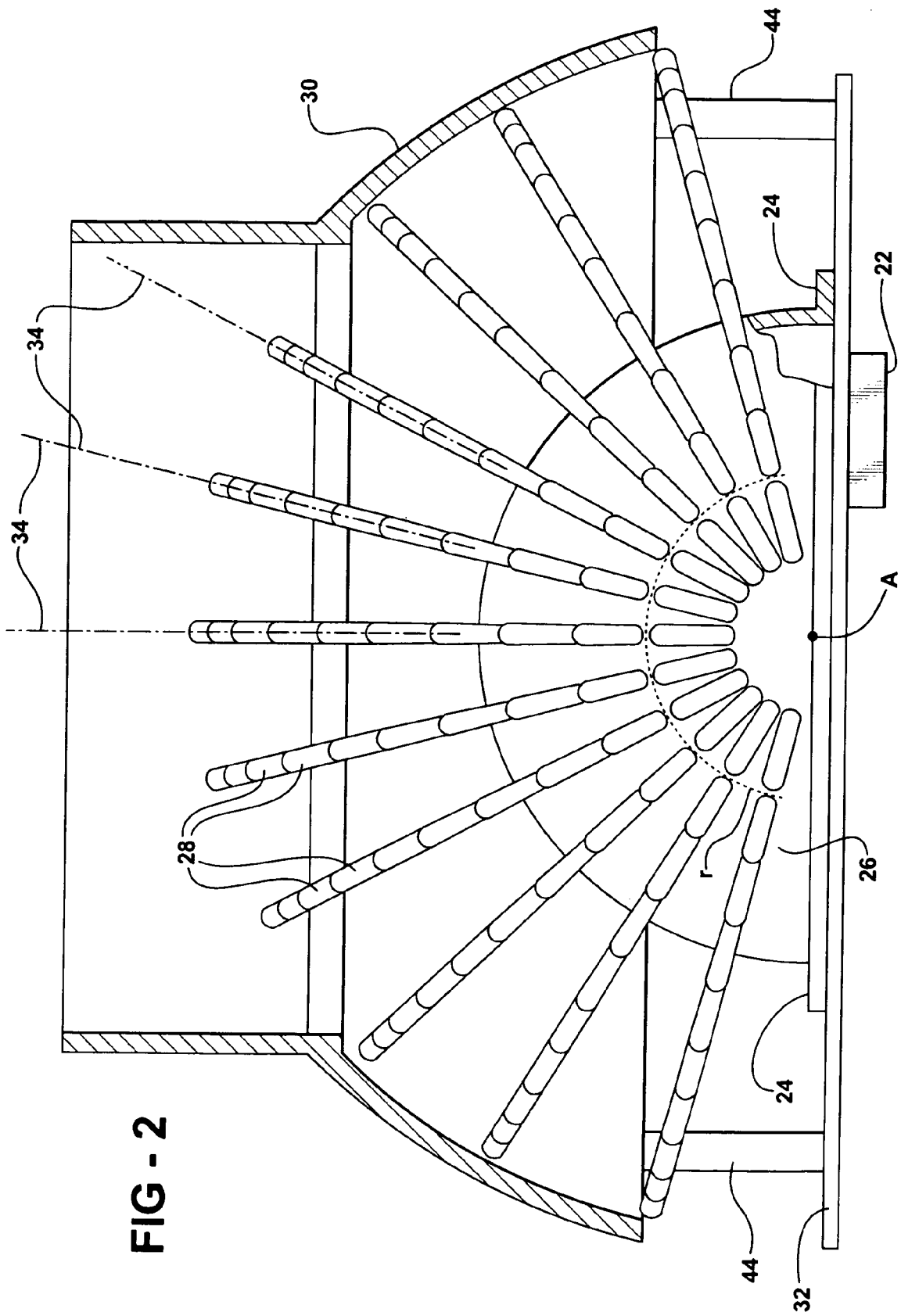
FIG. 2 is a diametrical cross-sectional view of the embodiment of FIG. 1 but including shroud.
Figure 3:
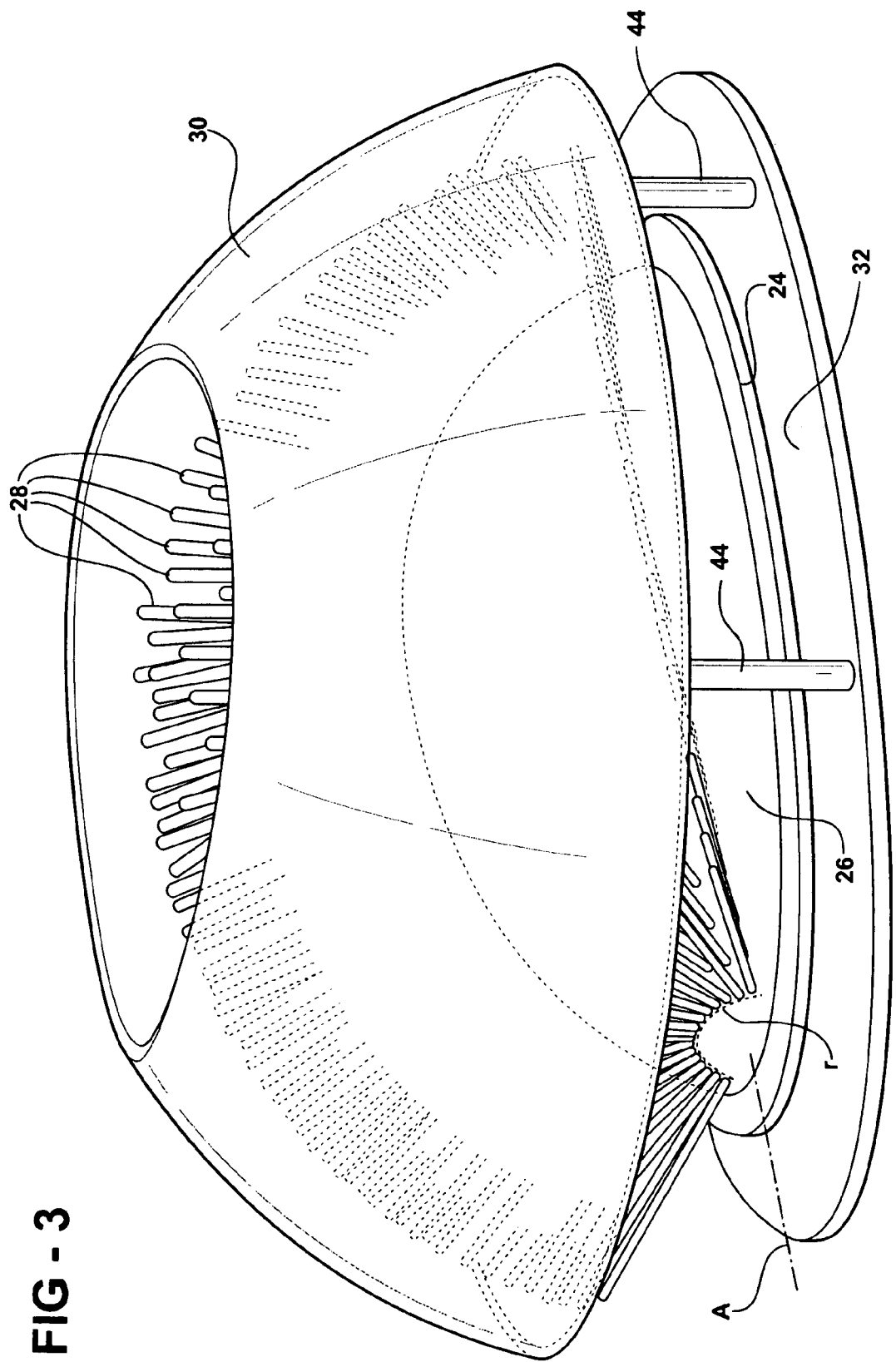
FIG. 3 is a perspective view of a second embodiment having an overall semi-ellipsoidal shape.
Figure 4:
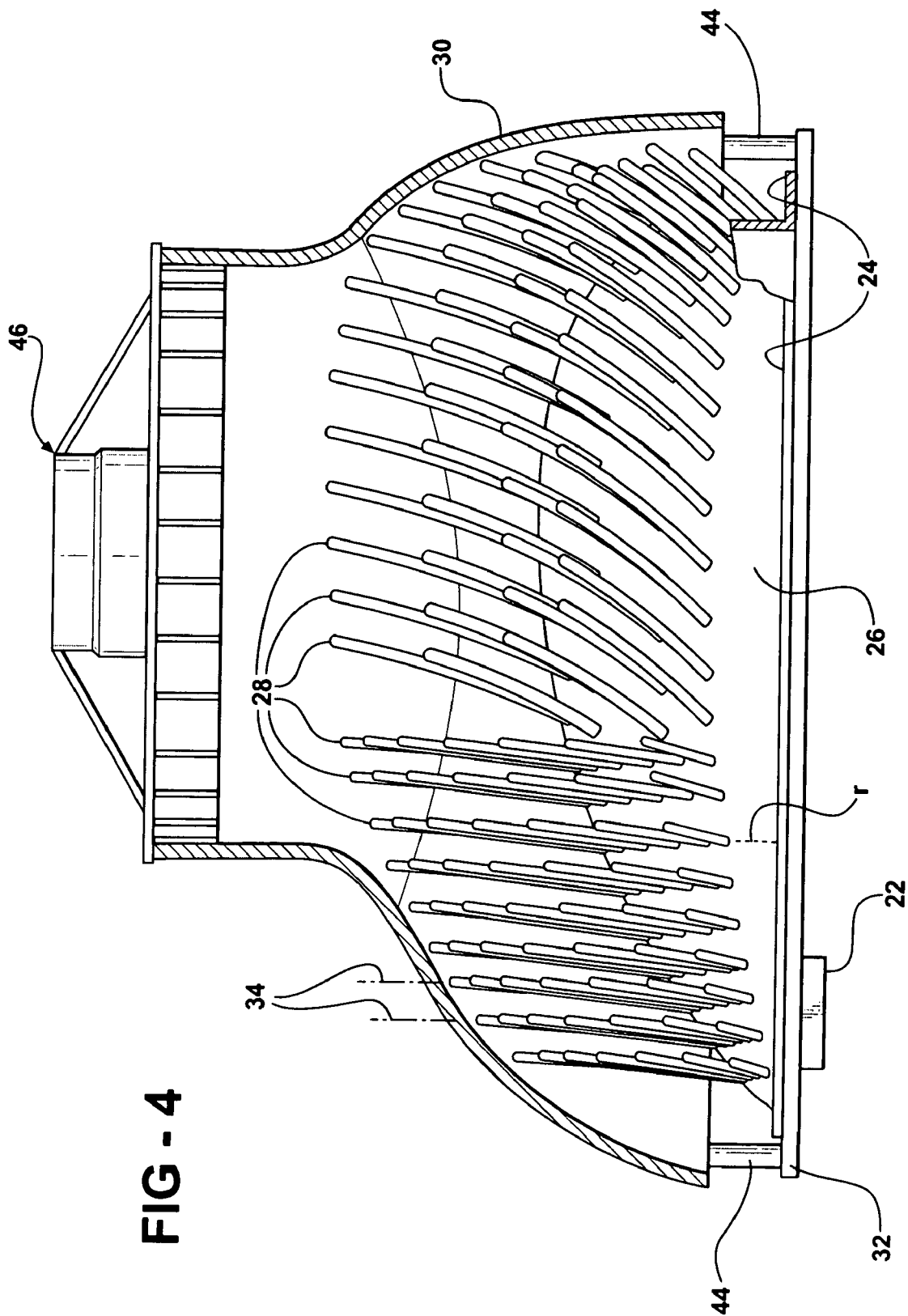
FIG. 4 is a cross sectional view of a third embodiment having an overall semi-logarithmic shape.

Referring to the Figures, wherein like numerals indicate corresponding parts throughout the several views, three embodiments of a heat exchanger assembly are shown respectively in FIGS. 1-2, 3 and 4, for cooling an electronic device 22 (FIGS. 2 and 4). The assembly includes a flange 24, a dome 26, a plurality of condensing tubes 28, a shroud 30, and a boiler plate 32.

The dome 26 has a center axis A and includes a flange 24, although the dome 26 may be welded or otherwise secured directly to the boiler plate 32 as illustrated in FIG. 1. As illustrated, the flange 24 is disposed on the periphery of the dome 26. The flange 24 may be integral to the dome 26 or it may be separate and connected by brazing or a fastening device well known in the art. The lower edge of the dome 26 engages the boiler plate 32 and the inside edge of the flange 24, and may be brazed thereto. The dome 26 defines a domed boiling chamber curved axially along and laterally from the center axis A. The boiler plate 32 is flat and is disposed beneath the flange 24. The boiler plate 32 is disposed over the electronic device 22, as well known in the art. A refrigerant is disposed in the boiling chamber defined by the dome 26 to receive heat from the electronic device 22 and to boil into vapor that is condensed into the liquid in a plurality of condensing tubes 28.

In the first embodiment shown in FIG. 1, the dome 26 is semi-spherical in shape. The distance measured axially along the center axis A is equal to the distance measured laterally from or perpendicular to the center axis A. In other words, the periphery of the semi-spherical dome 26 forms a circle over the boiler plate 32 with equal radii in all directions. When bisected transversely to the center axis A the dome 26 is divided into two equal sections which are mirror images of each other. The semi-spherical dome 26 yields an assembly with a high height compared to that of the other embodiments. Generally, the height of an assembly is indirectly proportional to its cooling fluid inventory. As such, the first embodiment operates with a higher fluid inventory than other assemblies shorter in height. To function in an orientation insensitive manner, the semi-spherical dome 26 must be filled to at least one half of its total volume to make sure it covers or is aligned with the electronic device 22.

The importance of fluid inventory is its corresponding relationship to safety in transportation. The issue of safety in transportation arises when refrigerants with low boiling points, such as R-134A, are utilized. As this invention or similar assemblies are transported to warmer climates, more of the enclosed low boiling point refrigerant vaporizes. Without the heat exchange equipment that is employed when the invention is in use, this resultant vapor does not condense into liquid form. Consequentially, the vapor pressure builds up inside the dome 26 thus creating the potential for an explosion.

In the second embodiment shown in FIG. 3, the dome 26 is semi-ellipsoidal in shape. The distance measured axially along the center axis A is greater than the distance measured laterally from or perpendicular to the center axis A, as opposed to the first embodiment where the two measurements are equal. In other words, the periphery of the semi-ellipsoidal dome 26 forms an ellipse over the boiler plate 32. When bisected transversely to the center axis A, the dome 26 is divided into two equal sections which are mirror images of each other. The semi-ellipsoidal dome 26 yields an assembly that is generally flatter than the first embodiment. As a result, the assembly is shorter in height and it operates with a lower fluid inventory than a similar assembly with a semi-spherical dome 26.

In the third embodiment shown in FIG. 4, the dome 26 is semi-logarithmic in shape and follows a logarithmic curve, at least most of the way along the center axis A. The shape is obtained by rotating a logarithmic curve about the center axis A. On one axial end (left end), the shape converges toward the center axis A ending in a point, whereas the other end (right end) of the shape terminates in another curve or a straight line across the center axis A. Like in the embodiment of FIG. 3, the distance measured axially along the center axis A is greater than the distance measured laterally from or perpendicular to the center axis A. When bisected transversely to the center axis A, the dome 26 is divided into two sections which are not mirror images of each other because one end of the dome 26 is more flat than the other more bulbous end. The semi-logarithmic dome 26 yields an assembly that is generally the flattest of the three embodiments. As a result, the assembly is shortest in height and it operates with the lowest fluid inventory of the three embodiments.

In all embodiments, the spaced condensing tubes 28 are disposed in a plurality of fan rows with each fan row being in a fan plane 34. Each fan plane 34 contains and extends radially from the center axis A, i.e., the center axis A is disposed in each fan plane 34. Each condensing tube 28 extends from the dome 26 to a closed distal end that is semi-spherical or domed in shape. The distal ends of the condensing tubes 28 in each of the fan rows in each fan plane 34 are aligned from one to another along curved paths (in an imaginary dome 26 extending in opposite directions from an imaginary transverse plane extending perpendicularly through the fan planes 34 and perpendicularly through the center axis A. The plane of the paper in FIG. 2 would be the transverse plane, i.e., the plane of the diametrical cross-section of the shroud 30. FIG. 2 shows the fan planes 34 including their respective fan rows extending perpendicularly to the transverse plane. Also, by extending radially from and including the center axis A to distal ends in an imaginary dome 26, the condensing tubes 28 in each row form a fan shape.

The condensing tubes 28 are spaced from one another in each associated fan plane 34 and diverge from one another in a fan-like fashion in each fan row along their respective fan planes 34. In all embodiments, the adjacent fan rows and fan planes 34 converge toward one another in opposite directions from the transverse plane. This convergence is best illustrated in FIG. 2 wherein the circumferential distance between the fan planes 34 decreases from the transverse plane to the ends of the center axis A where the condensing tubes 28 are more compactly spaced from one another about the center axis A. The pattern of the condensing tubes 28 resembles the erectile spines or quills of a porcupine except the condensing tubes 28 are aligned with one another.

The condensing tubes 28 in adjacent fan rows may also be aligned in a plurality of arced rows r, which extend concentrically about the center axis A. As such, each condensing tube 28 is aligned in both a fan row and an arced row r. The condensing tubes 28 in the arced rows r adjacent the transverse plane extend generally parallel to the transverse plane and the condensing tubes 28 in the arced rows r adjacent the center axis A extend generally across the transverse plane. In other words, the condensing tubes 28 in each of the arced rows r gradually change from a fan-like radial disposition of the condensing tubes 28 in the arced row r adjacent the transverse plane to a conical disposition of the condensing tubes 28 in the arced rows r about the center axis A adjacent or closer to the center axis A. Further, the spacing between next adjacent condensing tubes 28 in each arced row r decreases from arced row r to arced row r from the transverse plane to the center axis A, whereby the arced rows r adjacent the center axis A are more tightly or densely packed with the condensing tubes 28 than in the arced rows r adjacent the transverse plane.

The disposition and alignment of the condensing tubes 28 will leave spaces of bare surface on the dome 26, namely between fan rows and arced rows r. In these spaces, additional solid pin fins 36, as shown in FIG. 5, can be added to the dome 26 to further promote heat transfer.

Figure 5:
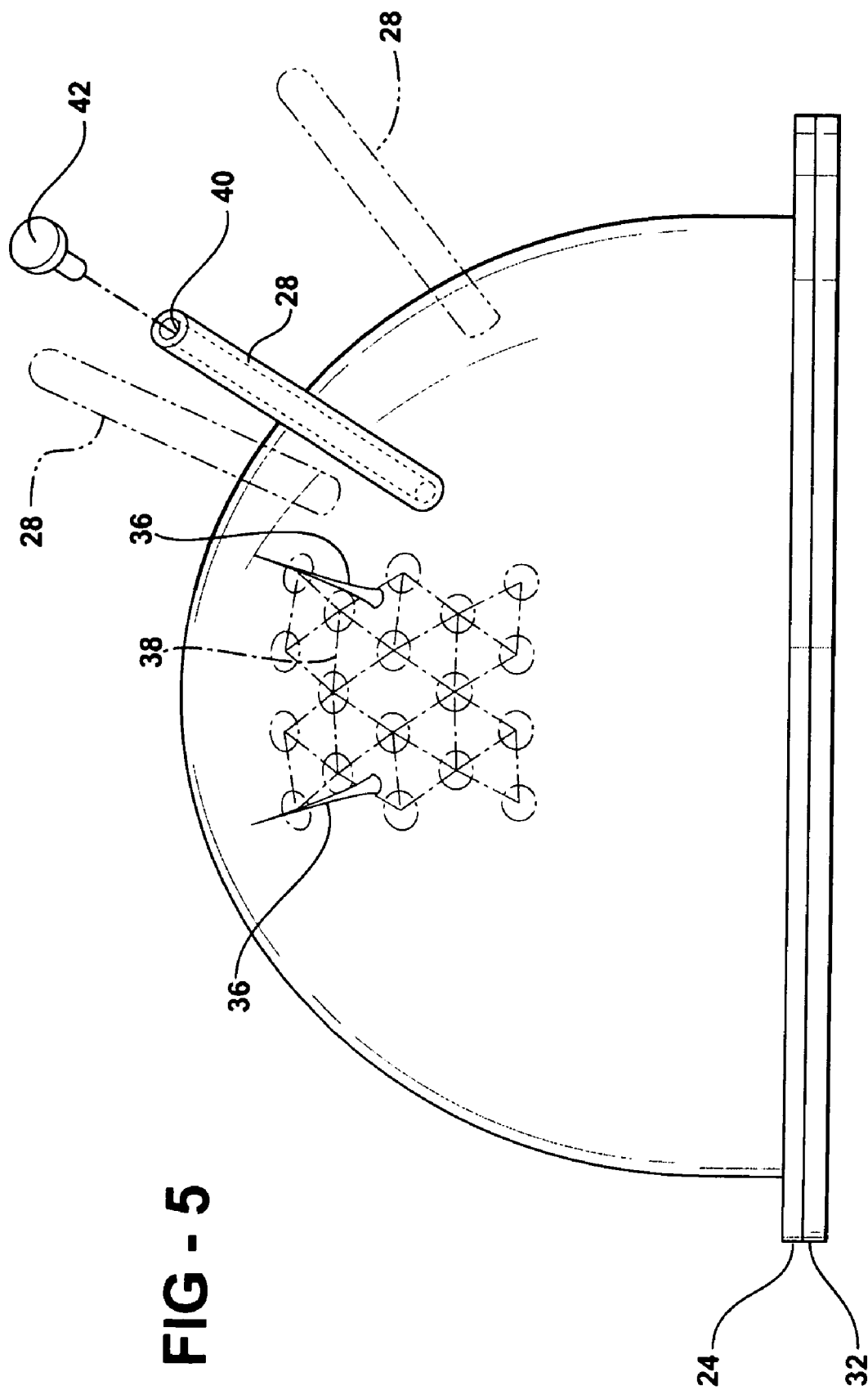
FIG. 5 is a side elevational view of a semi-spherical shape including embodiment including a charge port and a hexagonal condensing tube arrangement.

In addition to being aligned in fan rows and arc rows, the condensing tubes 28 can also be aligned in a close pack hexagonal arrangement 38, also shown in FIG. 5, which maximizes the number of condensing tubes 28 that can be disposed on the dome 26. In the close pack hexagonal arrangement 38, adjacent fan rows are offset axially to form a hexagonal pattern. Every other fan row is shifted along the fan plane 34 so that the condensing tubes 28 aligned in every other fan row are also aligned in arced rows r.

As shown in FIG. 5, at least one of the condensing tubes 28 defines an opening at its distal end to define a charge port 40. The charge port 40 provides an inlet for supplying refrigerant to the dome 26. Optionally, the diameter of at least one of the plurality of condensing tubes 28 to be used to define the charge port 40 can be increased in order to better facilitate delivery of refrigerant to the dome 26. After the refrigerant is supplied to the dome 26, the charge port 40 is sealed by inserting a fuse plug 42 into the charge port 40, crimping the charge port 40 and then brazing the fuse plug 42. Alternatively, the charge port 40 could be sealed by inserting and then solely brazing the fuse plug 42. As an added safety feature, the thickness of the material at the distal ends of the condensing tubes 28 can be engineered and manufactured such that the distal ends would rupture if a pre-determined internal pressure is reached, i.e., an over pressure relief valve. The charge port 40, fuse plug 42, pin fins 36, boiler plate 32 and the close pack hexagonal arrangement 38 shown in FIG. 5 can be used in all embodiments.

The refrigerant is disposed on the bottom of the boiling chamber in the dome 26 for undergoing a liquid-to-vapor-to-condensate cycle in response to the heat generated by the electronic device 22. However, the assembly may be disposed in any orientation whereby the actual position of the refrigerant will be determined by gravity, so long as it covers or reaches a level above the position of the electronic device 22. The refrigerant can be, but is not limited to, a low boiling point fluid such as R-134A or one with a higher boiling point such as water, which is recommended.

The shroud 30 encloses the distal ends of the condensing tubes 28 in radially spaced relationship to the dome 26 and the distal ends for containing and moving air over the condensing tubes 28 and over the dome 26. The invention is distinguished by the shroud 30 and the distal ends of the condensing tubes 28 being disposed in a domed shape in spaced relationship to the dome, i.e., a larger but like shape as the dome 26. Additionally, the shroud 30 contains a plurality of stand-offs 44 which mount to the boiler plate 32. The stand-offs 44 create an opening at the bottom of the dome 26 which allows air to circulate from the top of the shroud 30, over the condensing tubes 28, over the dome 26 and out the bottom.

FIG. 4 also shows an air cooling assembly 46 including a fan powered by a motor. The air cooling assembly 46 is used to move air over the condensing tubes 28, over the dome 26 and out the bottom of the shroud 30 to facilitate heat exchange. The air cooling assembly 46 can be used to push or pull air over the condensing tubes 28. Additionally, the air cooling assembly 46 can be remotely located and connected to the assembly via duct work as is known in the art. Similarly a liquid cooling assembly could be used to move liquid over the condensing tubes 28, over the dome 26, and under a closed shroud 30. In this case, a closed system, without stand-offs 44, would be necessary to avoid liquid leakage.

Figure 6:
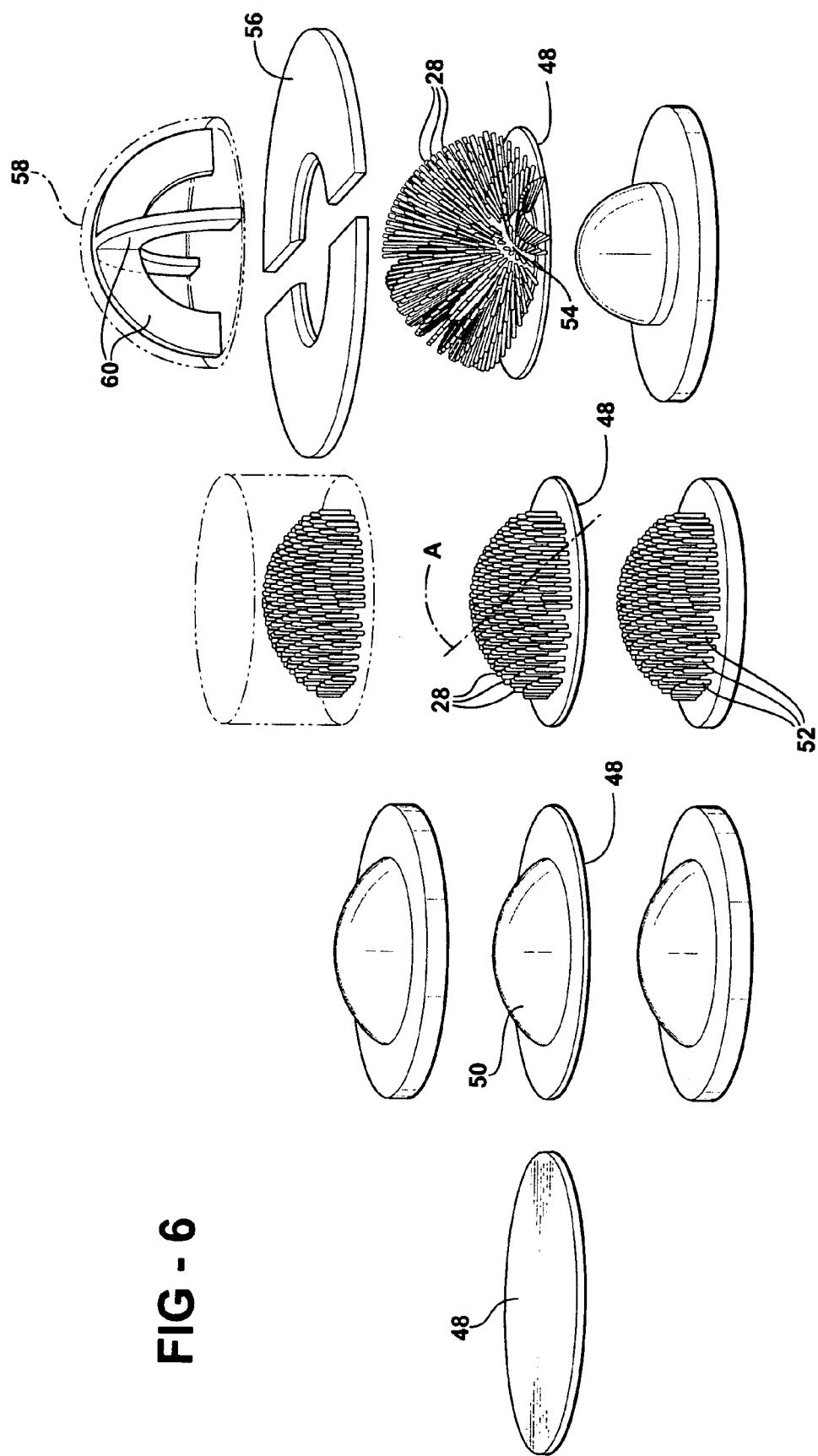
FIG. 6 is a schematic illustrating a method of fabricating one species of the invention.

As shown in FIGS. 6 and 7, the invention also includes a method of fabricating a heat exchanger assembly of the species that includes a plurality of condensing tubes 28 extending from a dome 26. The dome 26 and the condensing tubes 28 are formed through use of a progressive die system.

A plate 48 is formed into a shallow bulb 50 in an initial drawing operation between male and female dies. The male die is shaped like the shallow bulb 50 and the female die has a cavity in the shape of the shallow bulb 50. The plate 48 is disposed between the male and female dies and the male die is forced into the female die to form the plate 48 into the shallow bulb 50.

In the next step, a plurality of parallel condensing tubes 28 is formed with the condensing tubes 28 extending vertically relative to the upper surface of the bulbous plate 48 to distal ends disposed on the bulbous plate 48 and aligned in fan rows extending transversely across a central axis of the bulbous plate 48. The second drawing operation also utilizes a male and a female die. The male die has a plurality of parallel solid cylinders 52 disposed on its upper surface extending vertically from its upper surface to distal ends. The parallel solid cylinders are aligned in fan rows extending transversely across the center axis A. The female die is solid with a plurality of cylindrical openings that aligns with the solid cylinders of the male die. The bulbous plate 48 is disposed between the male and female dies and the male die is forced into the female die thus forming the plurality of condensing tubes 28 extending from the bulbous surface of the plate 48.

The final step deepens the shallow bulb 50 into a deep bulb 54 and fans out the forged condensing tubes 28. The final drawing operation also utilizes a male and a female die. The male die is shaped like the deep bulb 54. The deep bulb 54 extending from the upper surface of the plate 48 in the final drawing operation is deeper than the shallow bulb 50 extending from the upper surface of the plate 48 in the initial drawing operation. The female die has two separate components; a ring 56 that aligns with the outer perimeter of the male die, and a solid domed structure 58 that defines a cavity and includes two cross supports 60 that intersect perpendicularly within the solid domed structure 58. The ring 56 allows the solid cylinders to protrude upward into the cavity when the two dies are mated. The cross supports 60 are disposed in the solid domed structure 58 so as to be aligned between rows of condensing tubes 28 on the bulbous plate 48. The bulbous plate 48 with vertical condensing tubes 28 is disposed between the male and female dies and the male die is forced into the female die thus fanning out the forged condensing tubes 28 and creating the deep bulb 54 from the shallow bulb 50. The ring 56 is then stripped from the deep bulb 54 after forging. Next, the solid domed structure 58 is stripped. Two pronounced strips of bare surface on the deep bulb 54 result from the alignment of the cross supports 60 on the deep bulb 54 and the subsequent forging. The resultant deep bulb 54 becomes the upper surface of the dome 26.

In the alternative, the final step can implement a one-component female die. The die has a solid domed structure 58 that is connected to a ring 56, as opposed to the previous female die where the solid domed structure 58 and the ring 56 were separate components. The solid domed structure 58 defines a cavity and includes only one cross support 60, which is aligned between rows of condensing tubes 28 on the bulbous plate 48. The bulbous plate 48 with vertical condensing tubes 28 is disposed between the male and female dies and the male die is forced into the female die thus fanning out the forged condensing tubes 28 and creating the deep bulb 54 from the shallow bulb 50. The one-component female die is then stripped from the deep bulb 54 after forging. One pronounced strip of bare surface on the deep bulb 54 results from the alignment of the cross support 60 on the deep bulb 54 and the subsequent forging.

In its simplest combination, the method may only include forming the plurality of condensing tubes 28 extending vertically from an upper surface of a plate 48 to distal ends in fan rows extending parallel to a center axis A of the plate 48 and forcing a bulbous die into the bottom surface of the plate 48 to shape the plate 48 into the dome 26 with condensing tubes 28 in each fan row diverging from one another in fan-like fashion and the distal ends being disposed in a domed shape in spaced relationship to the dome 26.

Alternatively, the heat exchanger assembly could be fabricated by a lost wax method.

Obviously, many modifications and variations of the present invention are possible in light of the above teachings. The invention may be practiced otherwise than as specifically described within the scope of the appended claims.

What is claimed is:

1. A heat exchanger assembly for cooling the electronic device comprising;
   a boiler plate for disposition over the electronic device,
   a semi-spherical dome having a center axis and disposed on said boiler plate and defining a semi-spherical boiling chamber curved axially along and laterally from said center axis,
   a refrigerant disposed in said semi-spherical boiling chamber for undergoing a liquid-to-vapor-to-condensate cycle in response to the heat generated by the electronic device,
   a plurality of spaced condensing tubes disposed in a plurality of fan rows and extending from said dome to distal ends,
   a shroud enclosing said distal ends of said condensing tubes in spaced relationship to said dome for moving air over said condensing tubes and over said dome,
   said shroud and said distal ends of said condensing tubes being disposed in a domed shape in spaced relationship to said semi-spherical dome.

2. An assembly as set forth in claim 1 wherein each of said condensing tubes is in a fan plane containing and extending radially from said center axis.

3. An assembly as set forth in claim 2 including a plurality of said condensing tubes in each of said fan rows and spaced from one another in the associated fan plane.

4. An assembly as set forth in claim 3 wherein said condensing tubes in each fan row diverge from one another in a fan-like fashion.

5. An assembly as set forth in claim 4 wherein said distal ends of said condensing tubes in each of said fan rows are aligned from one to another along curved paths extending in opposite directions from a transverse plane extending perpendicularly through said fan planes and perpendicularly through said center axis.

6. An assembly as set forth in claim 5 wherein adjacent fan rows and said fan planes converge toward one another in opposite directions from said transverse plane.

7. An assembly as set forth in claim 5 wherein said condensing tubes in adjacent fan rows are aligned in arced rows extending concentrically about said center axis.

8. An assembly as set forth in claim 7 wherein said condensing tubes in said arced rows adjacent said transverse plane extend generally parallel to said transverse plane and said condensing tubes in said arced rows adjacent said center axis extend generally across said transverse plane whereby said arced rows gradually change from a fan-like radial disposition of said condensing tubes in said arced row adjacent said transverse plane to a conical disposition of said condensing tubes in said arced row about said center axis adjacent said center axis.

9. An assembly as set forth in claim 8 wherein the spacing between next adjacent condensing tubes in each arched row decreases from arched row to arched row from said transverse plane to said center axis whereby said arced rows adjacent said center axis are more tightly packed with said condensing tubes than said arced rows adjacent said transverse plane.

10. An assembly as set forth in claim 1 including a flange disposed on said boiler plate and surrounding said dome.

11. A heat exchanger assembly for cooling comprising;
    a boiler plate,
    a semi-spherical dome having a center axis and disposed on said boiler plate and defining a semi-spherical chamber curved axially along and laterally from said center axis,
    a plurality of spaced condensing tubes extending from said dome to distal ends,
    a plurality of said condensing tubes in each of a plurality of fan rows,
    each of said fan rows being in a fan plane extending radially from said center axis,
    said condensing tubes being spaced from one another in the associated fan plane,
    a shroud enclosing said distal ends of said condensing tubes in spaced relationship to said dome for moving air over said condensing tubes and over said dome,
    said shroud and said distal ends of said condensing tubes being disposed in a domed shape in spaced relationship to said dome.

* * * * *